(12) United States Patent
Vanden Brande et al.

(10) Patent No.: US 6,933,460 B2
(45) Date of Patent: Aug. 23, 2005

(54) METHOD AND DEVICE FOR PLASMA TREATMENT OF MOVING METAL SUBSTRATES

(76) Inventors: Pierre Vanden Brande, Vlierbeekberg 27, B-3090 Overijse (BE); Alain Weymeersch, rue Charles Jaumotte 33 boîte 10, B-1300 Wavre (BE)

(*) Notice: Subject to any disclaimer, the term of this patent is extended or adjusted under 35 U.S.C. 154(b) by 88 days.

(21) Appl. No.: 10/343,764

(22) PCT Filed: Aug. 6, 2001

(86) PCT No.: PCT/BE01/00130
§ 371 (c)(1), (2), (4) Date: Feb. 4, 2003

(87) PCT Pub. No.: WO02/12591
PCT Pub. Date: Feb. 14, 2002

(65) Prior Publication Data
US 2004/0026412 A1 Feb. 12, 2004

(30) Foreign Application Priority Data
Aug. 4, 2000 (EP) .......................................... 00202764

(51) Int. Cl.⁷ .............................................. B23K 9/00
(52) U.S. Cl. ........................... 219/121.43; 219/121.44; 219/651
(58) Field of Search .............................. 219/600, 601, 219/647, 651, 653, 121.11, 121.36, 121.39, 121.4, 121.41, 121.47, 121.59; 315/111.41, 111.71; 204/192.33, 298.32; 378/64, 66; 156/345.48

(56) References Cited

U.S. PATENT DOCUMENTS 3,654,108 A 4/1972 Smith
5,003,225 A * 3/1991 Dandl .................... 315/111.41
5,242,561 A * 9/1993 Sato ....................... 204/192.33
5,354,963 A 10/1994 Muller et al.
5,577,090 A * 11/1996 Moses ......................... 378/64
5,855,686 A 1/1999 Rust
6,099,667 A 8/2000 Vanden Brande et al.
6,551,447 B1 * 4/2003 Savas et al. ............ 156/345.48

FOREIGN PATENT DOCUMENTS

| EP | 0 146 446 | 6/1985 |
|----|-----------|--------|
| EP | 0 270 144 A1 | 6/1988 |
| EP | 0 396 919 A2 | 11/1990 |
| EP | 0 879 897 A1 | 11/1998 |

* cited by examiner

Primary Examiner—Tu Hoang
(74) Attorney, Agent, or Firm—Browdy and Neimark, P.L.L.C.

(57) ABSTRACT

The invention relates to a method of treatment, in particular cleaning and/or heating, for a metal substrate (1) fed in a substantially continuous manner through a vacuum chamber (3), having a treatment zone in which an electric discharge (10), i.e. a plasma, and a magnetic field are produced in a gas maintained at a pressure below atmospheric pressure between at least the substrate (1), acting as an electrode, and at least one counter-electrode (9) to enable the substrate (1) to be bombarded by the ions produced in the electric discharge (10). This method is characterised in that a confining magnetic induction field is produced entirely around the substrate (1) in the treatment zone so that the electric discharge (10) is also confined entirely around the substrate (1) inside this treatment zone by the confinement of electrons released in the electric discharge (10).

32 Claims, 8 Drawing Sheets

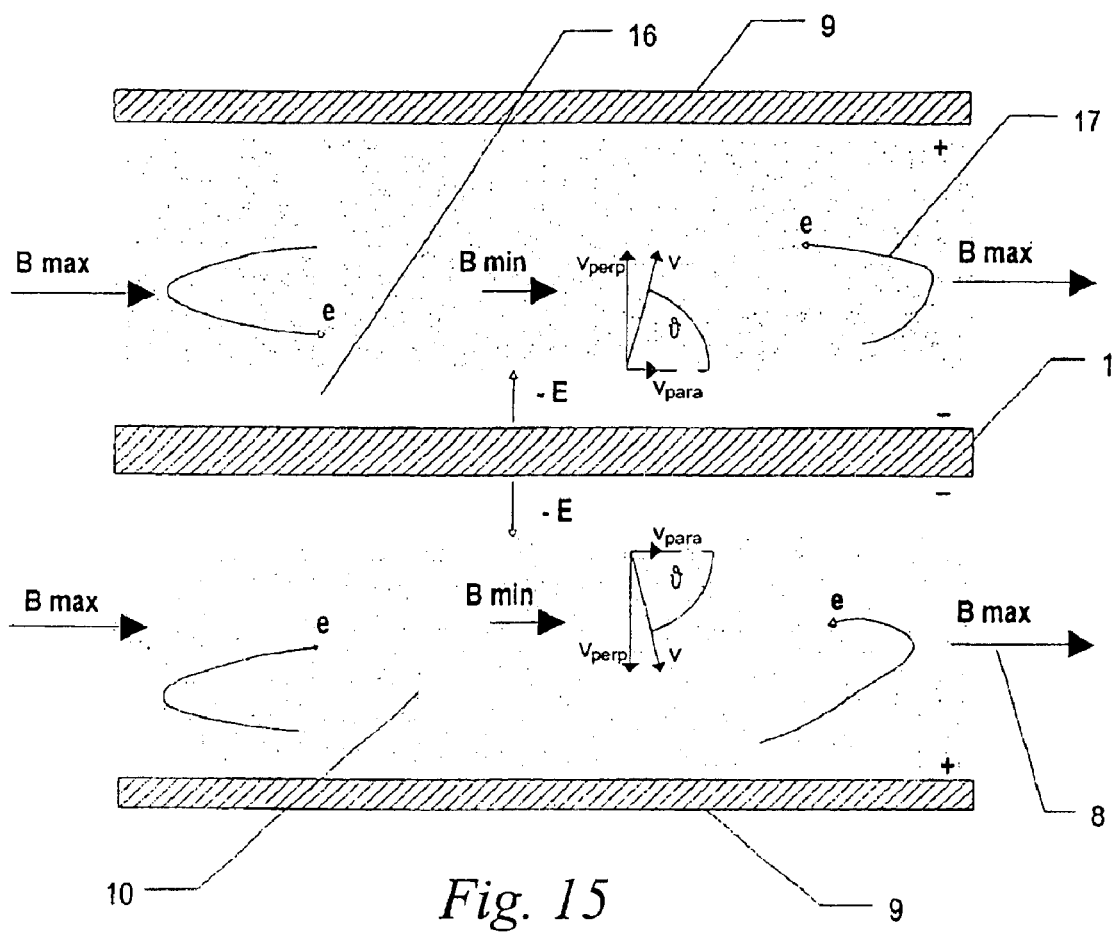
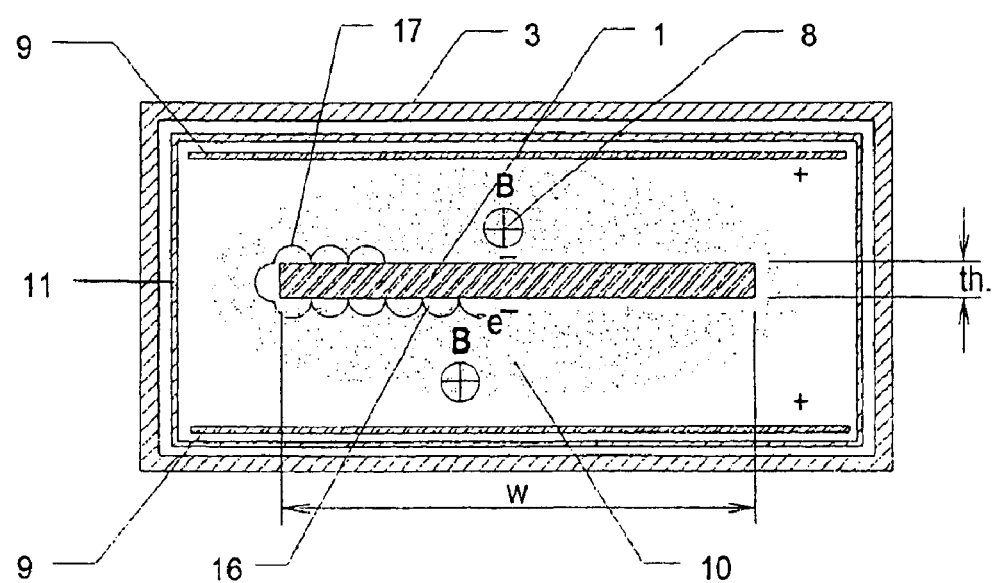
Fig. 15
Fig. 16

METHOD AND DEVICE FOR PLASMA TREATMENT OF MOVING METAL SUBSTRATES

The present invention relates to a treatment method, in particular cleaning and/or heating by means of an electric discharge, i.e. by plasma, for metal substrates such as products in the form of wires, tubes, beams, strips and/or sheets. During this process, the substrate to be treated is displaced in a given direction through an enclosure with a treatment zone, in which an electric discharge is generated between a counter-electrode and the substrate, close to the surface of the latter.

This process enables a layer of contamination to be removed from the substrate, such as superficial metal oxide and superficial carbon for example, in order to assist the adhesion of a coating applied to the product subsequently using vacuum deposition technology.

This process also enables the substrate to be effectively heated and can therefore be used as a means of annealing metal products. It may be used for substrates of mild steel, stainless steel, aluminium, copper and other metals.

Known methods of cleaning or heating a metal product by plasma have various disadvantages. For example, in the methods known from the prior art, it is not possible to treat all the external surfaces of the product in a single operation.

Specifically when treating a flat metal strip with a top face and a bottom face, the two faces are treated in succession by generating a plasma close to the two faces one after the other. A significant drawback of this approach is that the face treated during the first step can become contaminated again whilst the second face is being treated during the second step.

In order to be able to treat the metal strip efficiently, a magnetron discharge is generated on its surface by arranging systems of magnets to the rear of the surface to be treated.

Another major disadvantage of the known method is the problem of adapting the size of the systems of magnets to the width of the strip and the fact that it is impossible to treat wires and tubes using this technique.

One of the main objectives of the present invention is to propose a method which enables disadvantages of this nature to be overcome.

To this end, the method proposed by the invention consists in generating a confining field of magnetic induction entirely around the substrate in the region to be treated so that the electrical discharge is confined to the area entirely around the substrate due to the confinement of electrons released in the discharge, to enable a high-density plasma to form all around the substrate.

Advantageously, a magnetic induction field is created in said treatment zone substantially parallel with the axis along which the substrate is fed through this treatment zone, thereby enabling a magnetron discharge to form around the substrate by circulating electrons from the discharge along trajectories extending around the substrate.

In one particularly advantageous variant of the method proposed by the invention, at least one magnetic mirror is created at least partially around the substrate so that the electric discharge is mainly confined to the treatment zone around the substrate by this magnetic mirror.

For practical purposes, a magnetic induction field is created which extends substantially transversely to the direction of displacement of the substrate and which has a minimum value close to the surface of the substrate where the electrical discharge is confined.

In particular, the intensity of this magnetic field increases from the substrate to said magnetic mirror by a factor of at least two. Consequently, as they move away from the substrate, the electrons are reflected and sent back towards the substrate, the effect of which is to confine the electric discharge around the substrate.

In another advantageous embodiment, at least two magnetic mirrors are created through which the substrate is passed, and which define the inlet and the outlet of the treatment zone. These magnetic mirrors enable the electric discharge to be confined in a direction substantially parallel with the axis along which the substrate is fed through the treatment zone.

A magnetic induction field is formed by these magnetic mirrors substantially parallel with the feed direction of the substrate. The intensity of this induction field decreases at an increasing distance from each mirror towards the centre of the treatment zone.

The invention also relates to a device for treating a metal substrate, in particular for cleaning and/or heating a metal substrate, comprising a vacuum chamber provided with an inlet opening and an outlet opening for the substrate. The substrate may be fed through this vacuum chamber, which constitutes a treatment zone in which the electric discharge is created, in an essentially continuous manner. The device has magnetic means for confining electrons produced in the electric discharge and has at least one counter-electrode disposed facing the substrate, which acts as an electrode.

The device proposed by the invention is characterised in that the magnetic confinement means are disposed relative to the substrate so that the ions produced in the electric discharge can be kept entirely around the substrate and thus bombard its surface. More specifically, the magnetic confinement means are provided at least partially around the treatment zone.

At least one magnetic mirror is advantageously disposed around the treatment zone through which the substrate is fed in such a way that it reflects and sends back towards the substrate the electrons leaving the latter, thereby confining the electric discharge to this zone around the substrate.

The magnetic confinement means preferably comprise at least one solenoid around the treatment zone, the axis of which is substantially parallel with the feed direction of the substrate. The cross-section of the solenoid perpendicular to its axis may generally be of any shape, for example circular in the case of a cylindrical solenoid or rectangular in the case of a parallelepipedic solenoid.

In one particularly practical embodiment of the invention, the device has at least two magnetic mirrors between the inlet opening and the outlet opening, bounding the treatment zone in the direction in which the substrate is fed.

Other details and features of the invention will become clear from the description below, outlining specific embodiments of the invention in the form of examples, which are not intended to be restrictive, with reference to the appended drawings.

Figure 5:
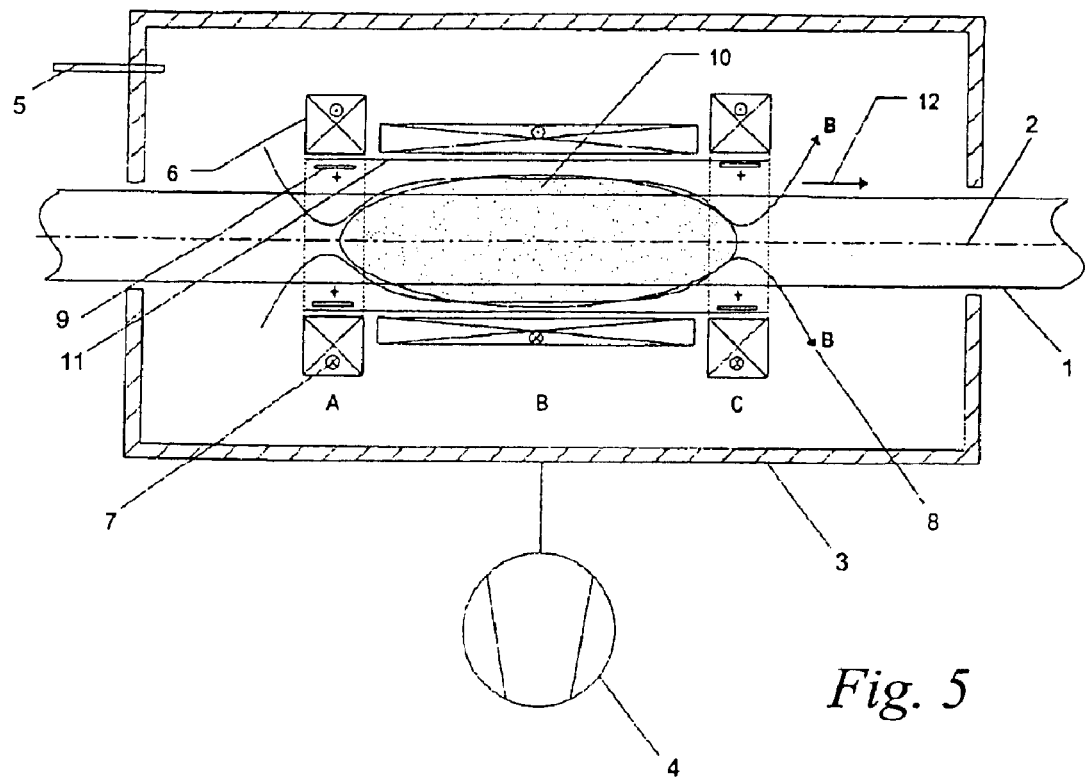

La FIG. 5 is a schematic diagram showing a cross-section through a third embodiment of the invention, parallel with the axis along which the product is fed.

Figure 6:
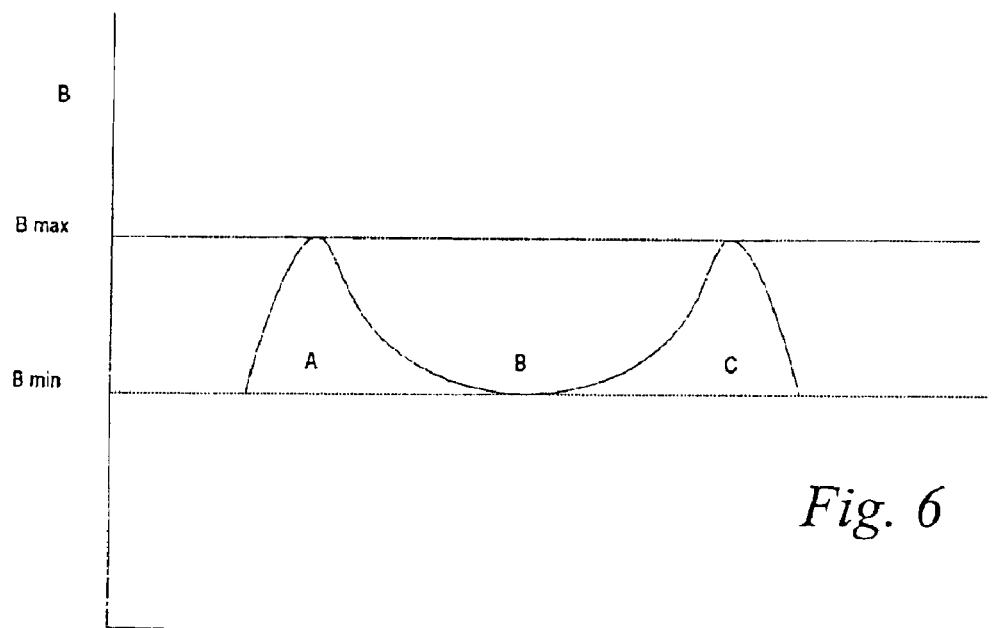

FIG. 6 is a graph plotting the value of the component of the magnetic induction field in the vicinity of the substrate in the direction in which the substrate is displaced through the device illustrated in FIG. 5.

Figure 7:
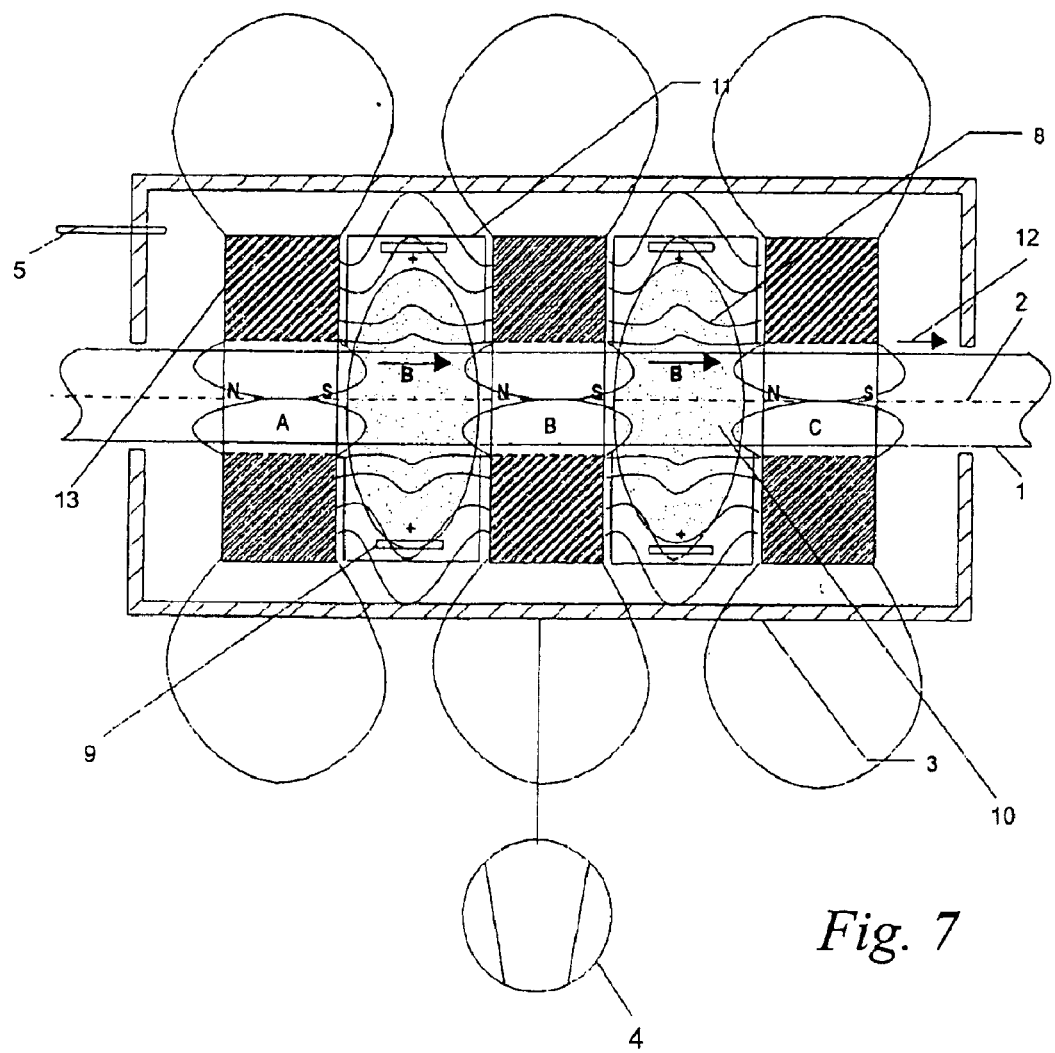

FIG. 7 is a schematic diagram showing a cross-section through a fourth embodiment of the device proposed by the invention, parallel with the axis along which the product is fed.

Figure 8:
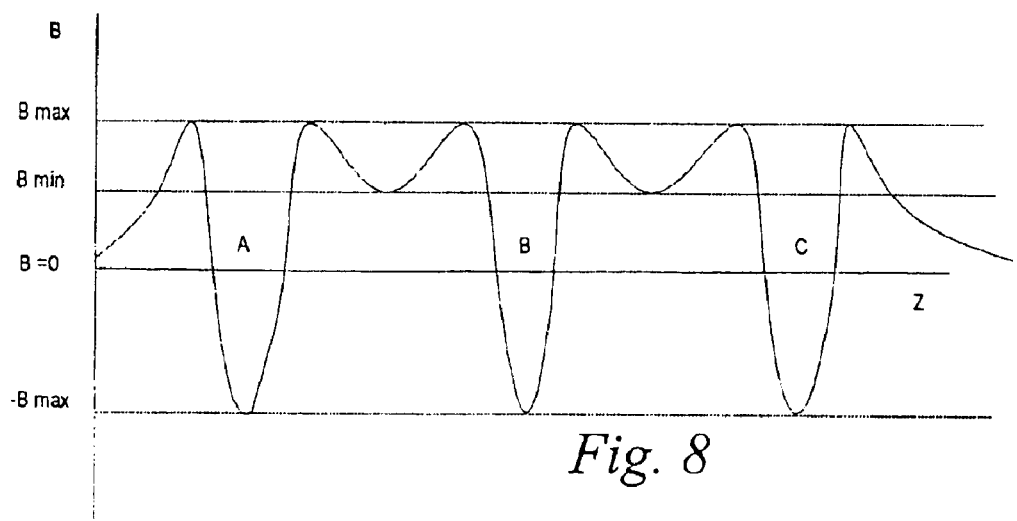

FIG. 8 is a graph plotting the value of the component of the magnetic induction field in the vicinity of the substrate in the direction in which the substrate is displaced through the device illustrated in FIG. 7.

Figure 9:
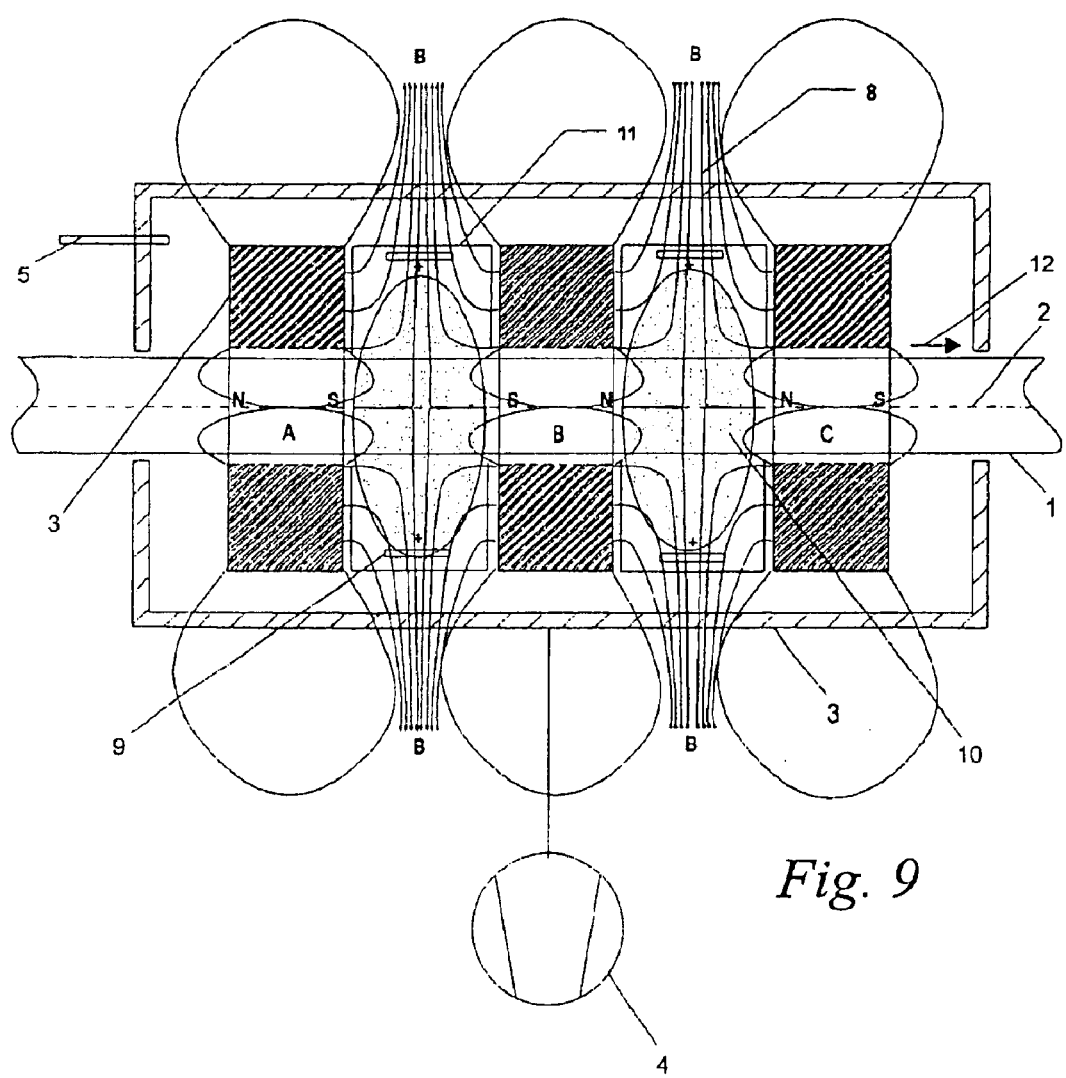

FIG. 9 is a schematic diagram showing a cross-section through a fifth embodiment of the device proposed by the invention, parallel with the axis along which the product is fed.

Figure 10:
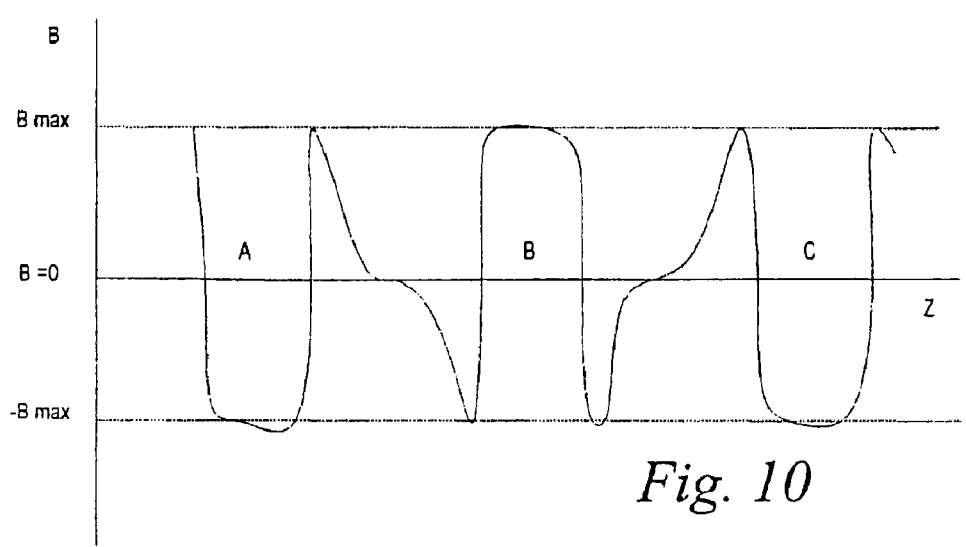

FIG. 10 is a graph plotting the value of the component of the magnetic induction field in the vicinity of the substrate in the direction in which the substrate is displaced through the device illustrated in FIG. 9.

Figure 11:
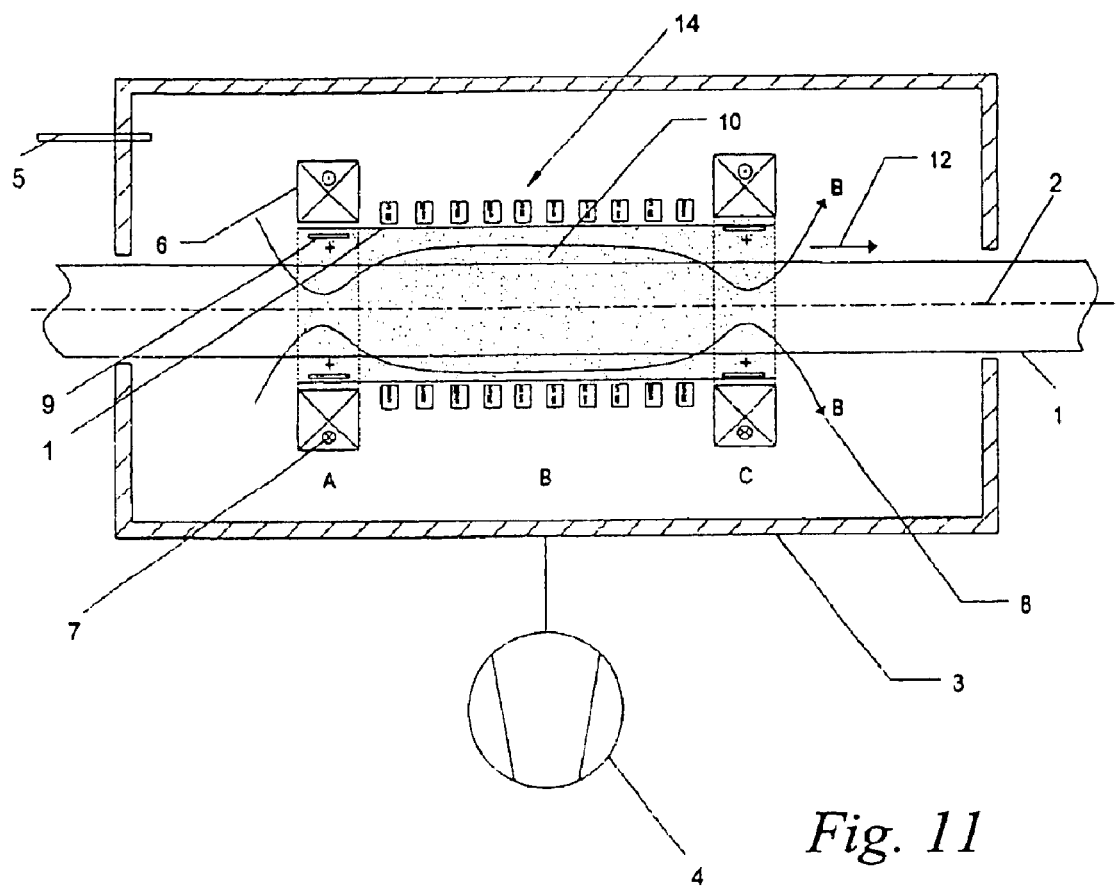

FIG. 11 is a schematic diagram showing a cross-section through a sixth embodiment of the device proposed by the invention, parallel with the axis along which the product is fed.

Figure 12:
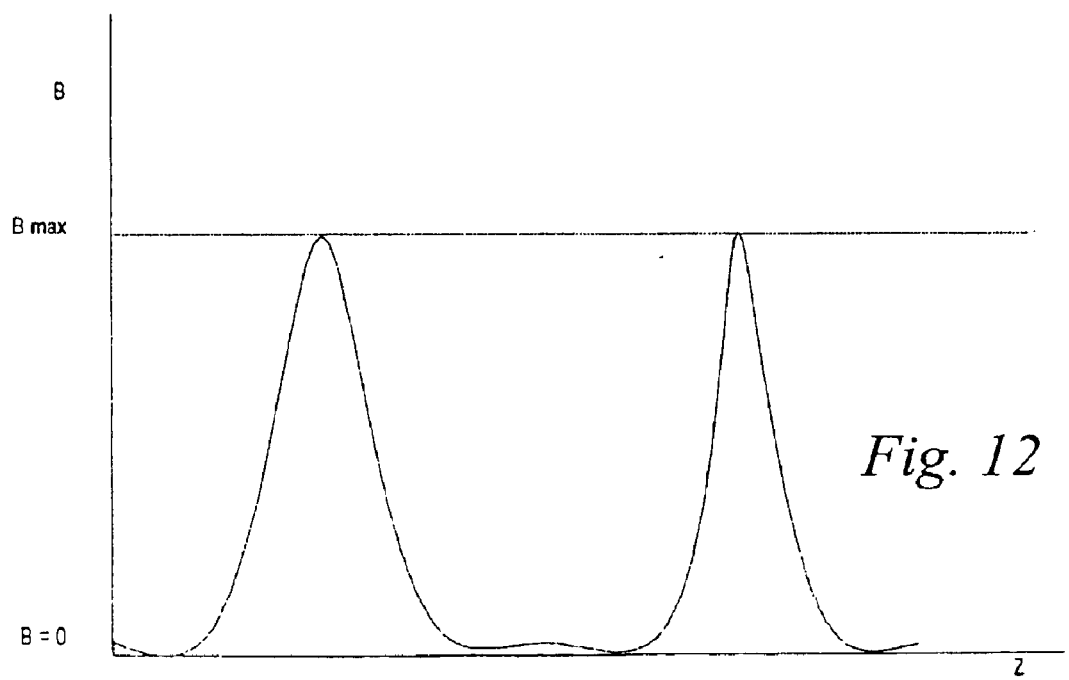

FIG. 12 is a graph plotting the value of the component of the magnetic induction field in the vicinity of the substrate in the direction in which the substrate is displaced through the device illustrated in FIG. 11.

Figure 13:
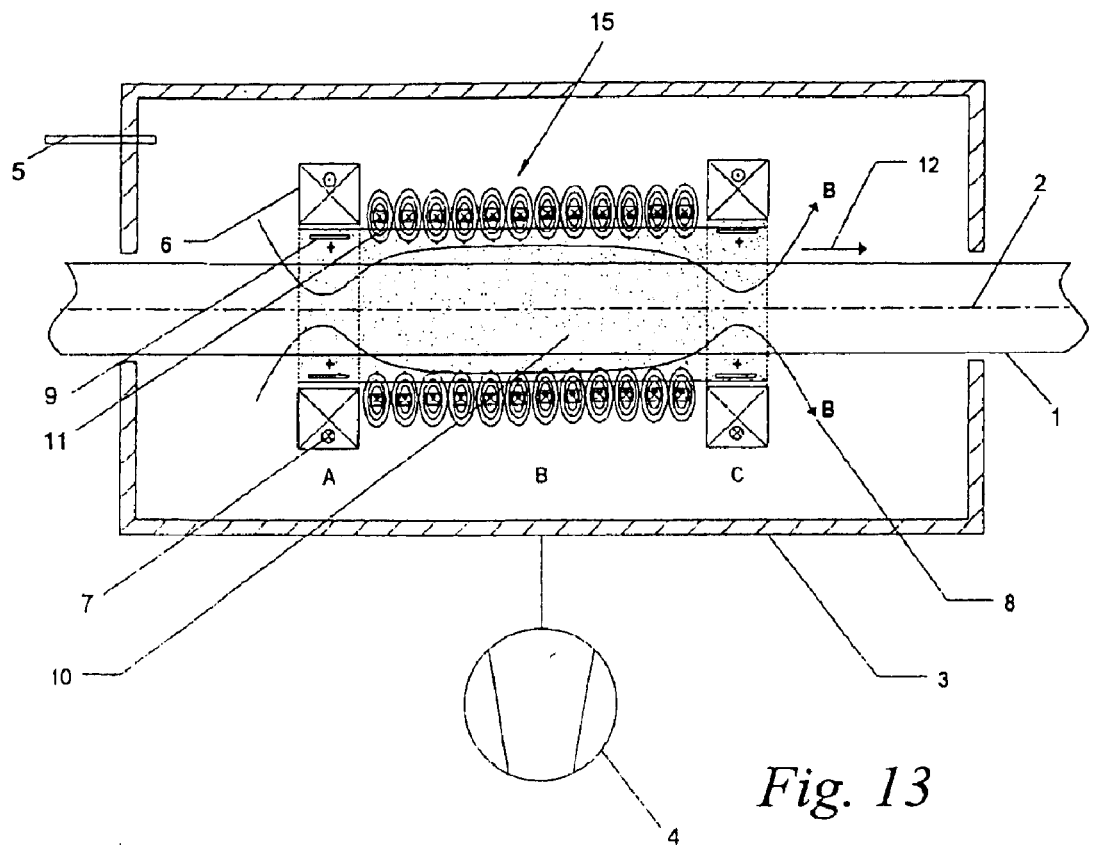

FIG. 13 is a schematic diagram showing a cross-section through a seventh embodiment of the device proposed by the invention, parallel with the axis along which the product is fed.

Figure 14:
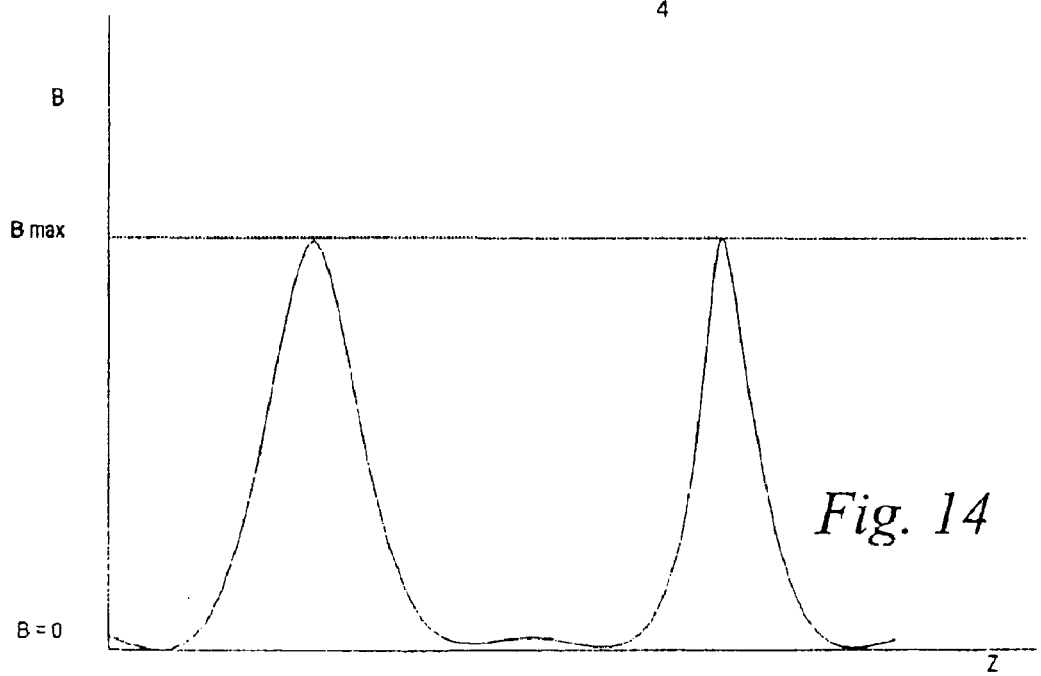

FIG. 14 is a graph plotting the value of the component of the magnetic induction field in the vicinity of the substrate in the direction in which the substrate is displaced through the device illustrated in FIG. 13.

FIG. 15 is a detail in cross-section, parallel with the axis along which the product is fed, this diagram providing a schematic illustration of the discharge, indicating the behaviour of the electrons between two magnetic mirrors.

FIG. 16 is a schematic diagram showing a cross-section perpendicular to the direction of displacement of the product, illustrating how a magnetron discharge is formed around the product.

The same reference numbers are used to denote identical or similar elements in the different drawings.

The method proposed by the invention consists in creating a plasma in the proximity of the surface of a substrate to be cleaned or heated, in a gaseous mixture containing, for example, one or more of the following elements: Ar, He, $H_2$, $O_2$ or $N_2$, or hydrocarbon compounds. The gas is maintained at a pressure P below atmospheric pressure, so as to generate radicals and ions enabling the substrate to be cleaned and the temperature to be raised. The pressure P may be between $10^{-2}$ Pa and 1000 Pa, for example.

By creating a plasma at a high density n in the gas maintained at low pressure, this process enables highly kinetic substrates to be cleaned or heated. This plasma density n generally corresponds to an electronic density of between $10^{10}$ cm$^{-3}$ and $10^{12}$ cm$^{-3}$. Because the plasma is at a high density, a high level of power can be dissipated at the surface of the substrate, mainly in the form of a bombardment of ions.

In particular, the electric discharge is generated by maintaining a maximum difference in potential between the substrate and a counter-electrode of less than or equal to 1000 V for average power densities of between 1 Wcm$^{-2}$ and 200 Wcm$^{-2}$ per unit surface area of the substrate.

The discharge needed to generate a plasma is obtained by polarising the substrate negatively with respect to a counter-electrode, either continuously or intermittently. In the former situation, the electric discharge is continuous and the counter-electrode is an anode. In the second situation, there is an alternating discharge, during which the substrate is bombarded with ions only when it is negatively polarised with respect to the counter-electrode.

The shape of the voltage signal used for an alternating discharge may be sinusoidal, simply rectified, square in the case of pulsed currents or generally of any other shape. The duration of the positive part of the voltage signal is not necessarily the same as that of the negative part over a cycle. The excitation frequency is typically between 1 kHz and 1 MHz and is preferably between 10 kHz and 100 kHz. The substrate is advantageously grounded.

By preference, the time during which the counter-electrode is negatively polarised with respect to the surface of the substrate is shorter than the time during which it is positively polarised.

Confining the electrons in the discharge between two or more magnetic mirrors past which the metal substrate is fed enables the density of a plasma generated around the latter to be increased.

By magnetic mirror in the context of the present invention is meant a magnetic field of a value that is relatively high compared with an adjacent magnetic field, so that any electrons present in this adjacent field and moving towards the high-value magnetic field can be reflected into the zone where the lower-value field prevails.

These magnetic mirrors may be provided in the form of two solenoids surrounding the metal substrate, for example, or alternatively as permanent magnets.

The method proposed by the invention offers a particularly practical way of treating long or continuous substrates. This being the case, the substrate is then displaced in its longitudinal direction through an enclosure in which the plasma is created.

In a preferred configuration, the magnetic mirrors are positioned so that they generate an induction field substantially parallel with the axis of displacement of the substrate, the field becoming stronger in the direction of each mirror. The magnetic induction field produced at the centre of a magnetic mirror is preferably at least equal to $5.10^{-3}$ T or 50 Gauss.

As schematically illustrated in FIG. 15, the secondary electrons generated as the surface of the substrate 1 is bombarded by the discharge ions and accelerated in a sheath 16 surrounding the surface of the substrate are reflected by the magnetic mirrors until they have lost the greater part of their kinetic energy in the ionisation process.

In effect, above a certain critical value of the component of the velocity vector $v_{perp}$ of an electron perpendicular to the direction of the induction field, which is substantially parallel with the direction of displacement of the substrate 1, the electron will remain confined between two adjacent magnetic mirrors.

By sheath is meant the area of the charging zone, the thickness of which is generally not more than a few millimeters, which is established and naturally separates any surface in contact with a plasma. If this surface is that of an electrode and if this electrode is brought to a negative potential with respect to that of a counter-electrode or anode, the sheath formed there is known as a cathodic sheath. The greater part of the difference in potential applied between this cathode and the counter-electrode or anode will thus be present on a level with this cathodic sheath. For this reason, the cathodic sheath is the site from which positive ions are accelerated towards the cathode and the site from which any secondary electrons emitted are accelerated towards the plasma following the impact of the ions with the cathode.

If $B_{min}$ represents the minimum magnetic induction field between two successive mirrors and $B_{max}$ corresponds to the magnetic induction field parallel with the central axis between these two mirrors, generated on a level with each mirror, it can be demonstrated that for an axial symmetry where $B_{min}$ is parallel with the direction in which the substrate 1 is displaced, an electron will remain confined between these two mirrors if the ratio of the perpendicular component $v_{perp}$ of the velocity of the electron to its total velocity modulus v is higher than a critical value of sin $\theta_{cr}=(B_{min}/B_{max})^{1/2}$ where $\theta$ is the angle between the direction of the induction field and the total velocity v. See for example: [J. R. Roth, Industrial Plasma Engineering, Vol. 1, IOP Publishing (1995), ISBN 0 7503 0318 2, pp 75–90]. See FIG. 15.

An electron will escape through the mirrors if the discharge angle $\theta$ is smaller than the critical discharge angle $\theta_{cr}$, which is mathematically expressed by the following equation:

$$\frac{v_{perp}}{v} = \sin\theta < \sin\theta_{cr7} = \sqrt{\frac{B_{min}}{B_{max}}}$$

Since the electric field E of the sheath 16 is always perpendicular to the magnetic induction field B due to the fact that the latter is substantially aligned with the axis of displacement of the substrate 1 to be treated and the voltage of the sheath 16 is high, the perpendicular component of the velocity vector of the electron $v_{perp}$ is always much higher than its component parallel with the magnetic induction field $v_{para}$ because the latter substantially corresponds to the mean thermal velocity of the electrons in the plasma, corresponding to a much weaker kinetic energy. The thermal energy of the electron is typically less than 10 eV in this type of plasma. This explains why the magnetic confinement of the secondary electrons remains very effective up to the point where, due to inelastic collisions, they lose almost all the energy gained as they are accelerated in the cathodic sheath 16. These electrons therefore rebound between the magnetic mirrors until the energy gained in the sheath 16 is exhausted.

The voltage of the sheath 16 is typically in the order of several hundred Volt.

Apart from this longitudinal motion, the electrons also describe a motion around the substrate (1), in a direction perpendicular to the induction field and in a direction perpendicular to the electric field (see FIG. 16). Finally, these electrons therefore describe a spiral trajectory 17 around the substrate 1 to be cleaned, rebounding continuously between the magnetic mirrors until the energy gained due to acceleration in the sheath 16 is exhausted. In effect, a magnetron discharge is obtained around the substrate 1 to be cleaned or heated, confined between two successive mirrors. Only the electrons whose discharge angle $\theta$ is smaller than the critical angle $\theta_{cr}$ can escape from the confinement zone, and can do so in a proportion that will again depend on the ratio of the induction fields $B_{min}$ between the mirrors $B_{max}$ on a level with the mirrors. In practice, only electrons which are "thermalised" over the course of numerous collisions will be able to escape through the magnetic mirrors. By "thermalised" electrons is meant electrons whose kinetic energy is reduced and reaches the mean value of the energy of the energy distribution of the electrons in the electric discharge. Accordingly, the counter-electrodes or the anodes can be positioned on a level with the magnetic mirrors without any risk of secondary electrons being picked up before they are thermalised. It can be demonstrated that the fraction $F_{th}$ of totally thermalised electrons which are trapped between the magnetic mirrors is:

$$F_{th}=(1-B_{min}/B_{max})^{1/2}$$

(J. R. Roth, Industrial Plasma Engineering, Vol. 1, IOP Publishing (1995), ISBN 0 7503 0318 2).

It is possible to use different specific configurations to confine the electrons and hence to confine the plasma at the external surface of the substrate.

Figure 1:
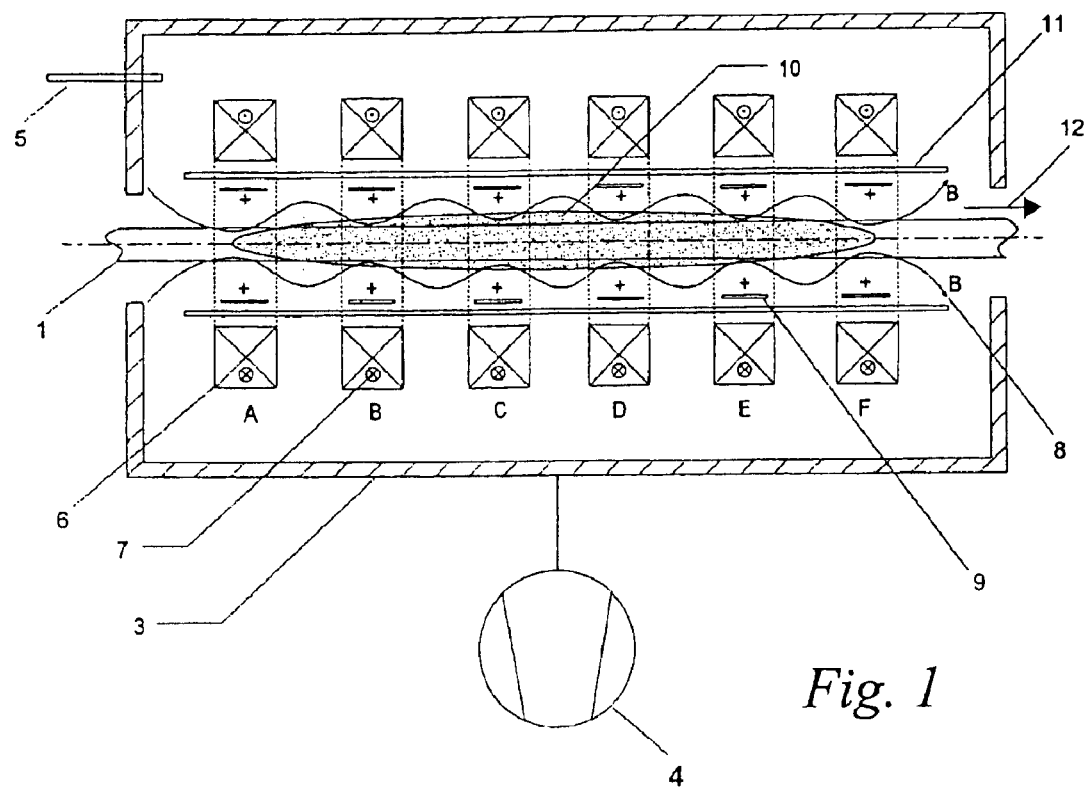
FIG. 1 is a schematic diagram showing a cross-section through a first embodiment of the device proposed by the invention, parallel with the axis along which the product is fed.

A first method is based on confining the discharge between two adjacent mirrors in the direction perpendicular to the axis along which the substrate is displaced, due to the presence of an axial magnetic field, as illustrated in FIGS. 1, 5 and 7. The latter enables the coefficient of ambipolar diffusion $D_{perp(a)}$ of the plasma in the direction perpendicular to the feed axis to be reduced to the value of the coefficient of diffusion $D_{perp(e)}$ of the electrons in this same direction, this value being much lower than the value of the coefficient of ambipolar diffusion of a non-magnetised discharge $D_a$. See [M. A. Lieberman, A. J. Lichtenberg in Principles of Plasma Discharges and Material Processing, Wiley Interscience, ISBN 0471005770, NY(1994), pp 129–145].

The presence of the magnetic induction field in the direction of displacement of the substrate in effect limits the diffusion of the plasma in the direction disposed transversely to the direction of displacement of the substrate, perpendicular to the lines of the magnetic induction field, by forcing the electrons to rotate about the same field line until they collide with another particle, for example an atom or a gas molecule. This configuration also has the advantage of generating a magnetron discharge around the treated substrate, the effect of which is to further improve confinement of the plasma around the substrate. This configuration can be set up using two magnetic mirrors generating a field in the same direction.

In order to generate such a magnetron discharge, the magnetic induction field parallel with the feed axis of the substrate is advantageously at least equal to $10^{-3}$ T (1 T=1 tesla) and is preferably between $10^{-3}$ T and 0.25 T in the treatment zone.

In a preferred embodiment of the invention, the magnetic induction field is heightened by other means in the direction in which the substrate is displaced, for example by incorporating a third solenoid between the two magnetic mirrors or by the presence of permanent magnets between the mirrors.

It is also possible to provide the treatment zone with only one magnetic induction field parallel with the direction of displacement of the substrate, obviating the need to install magnetic mirrors, if the treatment zone is long enough for plasma losses to be kept low at the inlet and outlet of this zone relative to the plasma generated in this same zone.

Figure 3:
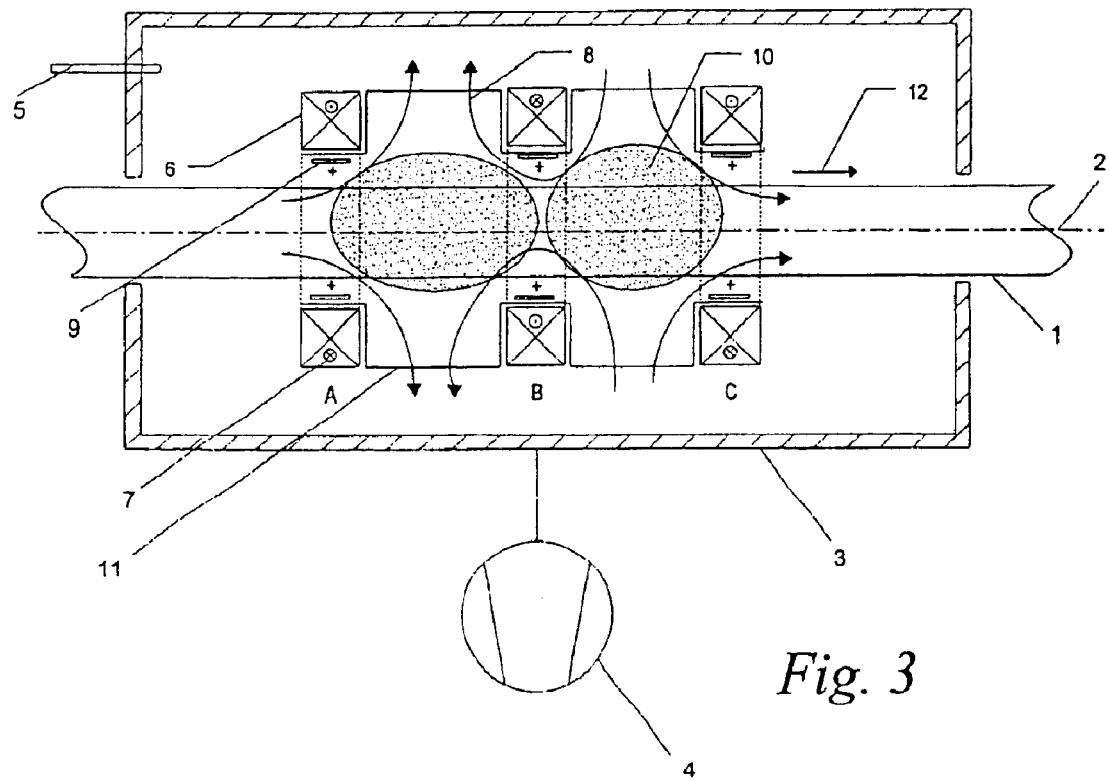
FIG. 3 is a schematic diagram showing a cross-section through a second embodiment of the device proposed by the invention, parallel with the axis along which the product is fed through the device.

A second method is to confine the secondary electrons in the space bounded by two mirrors by using a specific configuration of the latter, known under the name of a magnetic cusp, as illustrated in FIGS. 3 and 9. In this instance, the fields produced by two adjacent mirrors parallel with the feed axis are inverted at a cusp, the effect of which is to produce a confinement zone for the electrons both in the direction of displacement of the substrate and in the direction perpendicular to this direction.

In practical terms, this configuration has the advantage of generating a magnetic mirror around the substrate in the treatment zone in addition to the magnetic mirrors through which the product passes. The component of the magnetic induction field parallel with the feed axis disappears at the cusp point. See [J. R. Roth, Industrial Plasma Engineering, Vol. 1, IOP Publishing (1995), ISBN 0 7503 0318 2, p 83].

A third method uses a multi-polar magnetic confinement on a surface of revolution surrounding the substrate to be treated, between the two magnetic mirrors through which the latter passes. This multi-polar confinement may be produced by a juxtaposition of permanent magnets, as illustrated in FIG. 11 for example.

Another known method is to pass currents in reverse directions (FIG. 13) through closed solenoids surrounding the product and mutually spaced apart. These solenoids may be reduced to wires surrounding the product, through which currents are successively passed in reverse directions. Seer [J. R. Roth, Industrial Plasma Engineering, Vol. 1, IOP Publishing (1995), ISBN 0 7503 0318 2, p. 88–90] et [M. A. Lieberman, A. J. Lichtenberg in Principles of Plasma Discharges and Material Processing, Wiley Interscience, ISBN 0471005770, NY(1994), pp 146–150].

A significant advantage of the method proposed by the invention is that, unlike conventional magnetron etching processes, it enables a magnetron discharge to be generated around substrates with cross-sections of different shapes. The method is suitable for cleaning substrates in the form of T, I or U-shaped beams, wires or bundles of wires, strips, sheets, etc., for example. It may also be used to treat the edges of sheeting. The method proposed by the invention does not in fact require the presence of permanent magnets positioned to the rear of the substrate, nor does it require any complicated devices to adapt to different widths of strips. See for example: EP535568, EP780485, EP879897, D136047, EP878565, EP908535, [S. Schiller, U. Heisig, K. Steinfelder and K. Gehn, Thin Solid Films, 51(1978)191].

The method may be used to clean the external surface of a product by bombarding it with ions from the plasma. This being the case, to ensure a highly kinetic cleaning action, it is preferable to operate at a sufficiently low pressure, preferably at a pressure below 1 Pa, to prevent the ions accelerated in the cathodic sheath from colliding before they hit the surface of the substrate.

In order to clean the substrate, an electric discharge is generated in a gas which is advantageously maintained at a pressure below 1 Pa and preferably between 1 Pa and 0.01 Pa in the treatment zone.

If the process is used as a means of annealing a metal product and it is desirable to prevent the external surface from being eroded due to ion bombardment, it is preferable to operate at a pressure such that the ions collide with the atoms or gas molecules a number of times as they are accelerated in the cathodic sheath. The surface of the substrate is eroded to a significantly lesser degree because the energy is applied to it by a larger number of particles. In practice, the particles do not have enough kinetic energy to pulverise the superficial atoms when they arrive at the external surface of the metal product. A heating process is generally operated at a pressure above 1 Pa, and preferably at a pressure in the order of 10 Pa.

To heat the substrate, an electric discharge is produced in a gas which is advantageously maintained at between 10 Pa and 1000 Pa.

FIG. 1 illustrates a first embodiment of the device proposed by the invention, in which a substrate 1 is displaced along an axis of displacement 2 in the direction of arrow 12 through a tank 3, constituting a vacuum chamber, connected to a pumping unit 4. The pumping unit 4 enables a gas in the tank 3 to be kept at a low pressure. A tube 5 passes through the wall of the tank 3 to enable a gas or a gaseous mixture needed for cleaning or heating to be injected into the latter.

In this particular case, the device is provided with six coaxial solenoids 6 (A, B, C, D, E, and F) disposed in the interior of the tank 3, which enable a magnetic induction field B to be created at the centre of the solenoids 6, substantially parallel with the displacement axis 2.

The general pattern of the lines of the magnetic induction field created by the solenoids 6 is indicated by line 8.

The interior of each of the solenoids 6 is provided with a counter-electrode 9 with a rectangular or cylindrical cross-section so that it surrounds the entire surface of the substrate 1.

Mounted in the gap between the solenoids 6 and the counter-electrodes 9 is an electrostatic confinement enclosure 11 providing electrical insulation against the walls of the tank 3. This electrostatic confinement enclosure 11 is electrically isolated from the substrate 1 and the tank 3 and is therefore kept at a floating potential with respect to the potential of the substrate 1 and with respect to the potential of the tank 3. This avoids creating a discharge on the walls of the tank 3 and the solenoids 6 are protected from the substance removed from the substrate 1 during cleaning. This enclosure 11 also enables any metal torn away from the substrate by the bombardment of ions to be recovered. It is preferably tubular in design.

A discharge 10 is produced between the substrate 1 and the counter-electrodes 9. The magnetic induction field B generated by the solenoids 6, through which electric currents are fed in a same direction as indicated by the orientation of arrow 7 perpendicular to the plane of FIG. 1, is essentially parallel with the axis of displacement 2. Consequently, the orientation of the induction field B is substantially constant. The intensity of the latter varies along the axis of displacement 2. Arrow 7 represents the current vector seen from one of its ends.

Figure 2:
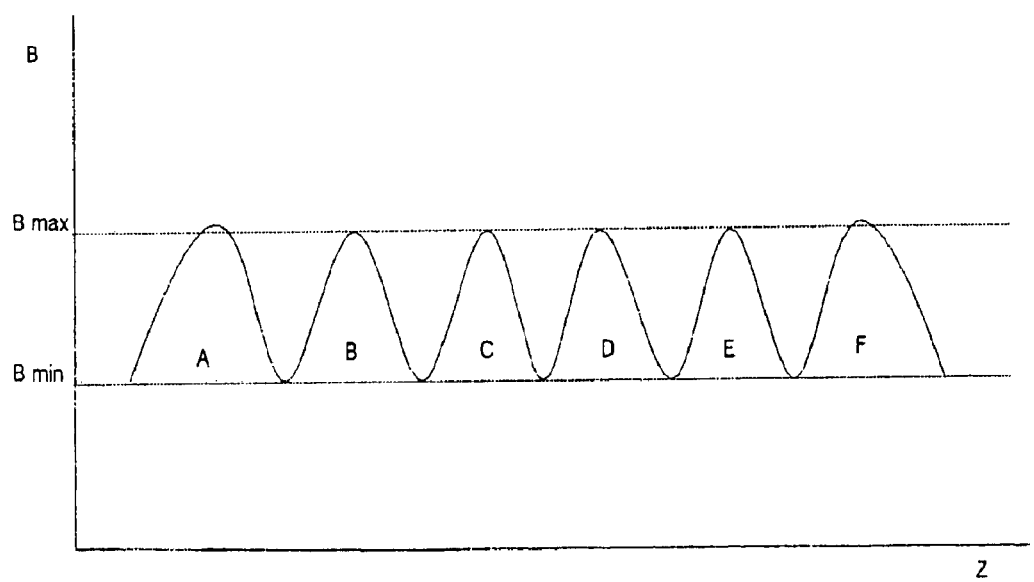
FIG. 2 is a graph plotting the value of the component of the magnetic induction field in the vicinity of the substrate in the direction in which the substrate is fed through the device illustrated in FIG. 1.

The induction field is at its maximum and at a value of $B_{max}$ on a level with each solenoid and is at a minimum ($B_{min}$) between two successive solenoids 6, as clearly illustrated in FIG. 2.

Consequently, the electrons are generally confined between two successive solenoids as long as the discharge angle θ remains greater than the critical discharge angle $θ_{cr}$. The solenoids are close enough to permit the presence of a minimum induction field $B_{min}$ that is not zero parallel with the displacement axis 2. A magnetron discharge is produced between two successive solenoids around the product to be treated as a result.

Figure 4:
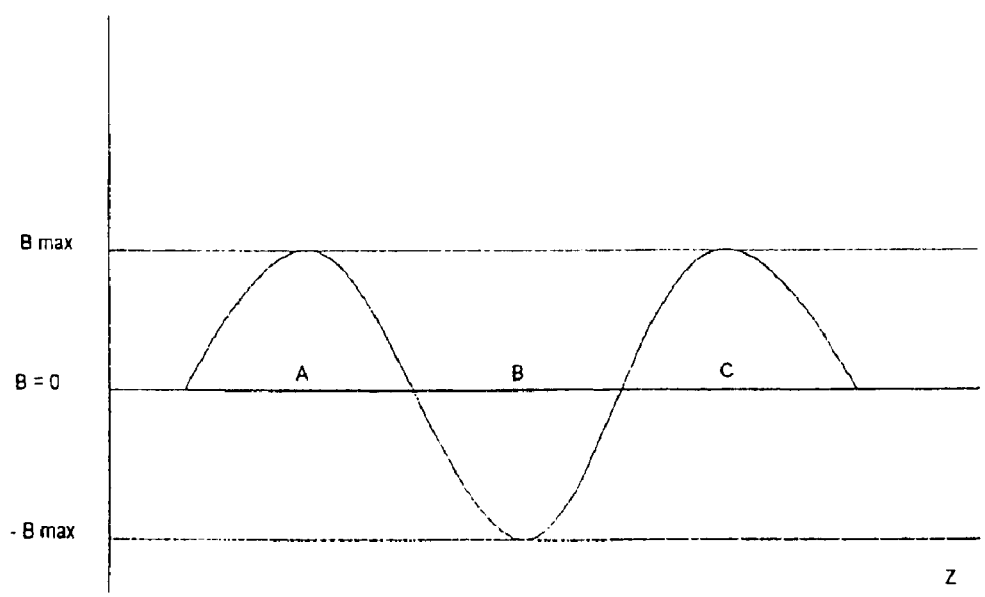
FIG. 4 is a graph plotting the value of the component of the magnetic induction field in the vicinity of the substrate in the direction in which the substrate is fed through the device illustrated in FIG. 3.

The embodiment of the invention illustrated in FIG. 3 differs from the previous embodiment due to the fact that a discharge is produced between three solenoids 6 through which a current is passed successively in reverse direction. This being the case, the magnetic induction field 8 remains substantially parallel with the displacement axis 2 only on a level with the solenoids 6. Between two successive solenoids, it is disposed transversely to the displacement axis 2. The magnetic induction field 8 is therefore at its maximum, in terms of absolute value, at the centre of the solenoids A, B and C. The field parallel with the axis of displacement 2, on the other hand, is rapidly disappears between two solenoids in the vicinity of the product, as illustrated in FIG. 4. This configuration enables a magnetic mirror to be formed around the product 1 between two successive solenoids, as clearly illustrated in FIG. 3, due to the concentration of field lines 8 around said product between two successive solenoids.

Consequently, the plasma 10 is also confined in a direction perpendicular to the axis 2 because the intensity of the magnetic induction field in this direction increases due to the field inversion produced by 2 successive solenoids. The plasma is therefore confined in a zone bounded by two successive solenoids 6, which on the one hand form magnetic mirrors perpendicular to the displacement axis and on the other a magnetic mirror surrounding the substrate 1, the magnetic mirror surrounding the substrate 1 being generally of any section and conforming to the shape of the product, i.e. rectangular in the case of a strip and cylindrical in the case of a beam or wire, being disposed between two successive solenoids.

FIG. 4 clearly illustrates the presence of a point at which the magnetic induction field B parallel with the displacement axis disappears and is reversed on the axis 2.

The embodiment of the invention illustrated in FIG. 5 corresponds to the preferred situation where three successive solenoids A, B and C are fed with current in the same direction and generate a magnetic field in the same direction.

A magnetron discharge around the substrate 1 is produced between two successive solenoids 6. The mirrors A and C and the third solenoid B enable a magnetic induction field to be produced parallel with the axis of displacement 2. This configuration is particularly practical because it generally enables a magnetron discharge to be generated around the substrate 1 across any length under relatively uniform conditions with a high density of plasma. Using solenoids A, B and C with rectangular sections enables metal strips such as wires, beams or tubes to be treated, for example.

The electrons from the discharge are confined to the interior of solenoid B by the magnetic mirrors formed by solenoids A and C as long as the output angle θ is greater than the critical angle $\theta_{cr}$ (cf supra). The intensity of the magnetic induction field parallel with the axis of displacement 2 is at is maximum at the centre of solenoids A and C and at a minimum in the middle of solenoid B, as illustrated in FIG. 6.

Successive assemblies of this type can be set up one after the other so that each mirror (solenoid A or C) is followed by a solenoid of type B, thereby permitting a magnetron discharge in a sequence of the type: ABABABA.

The configuration of the device proposed by the invention illustrated in FIG. 7 is a configuration of the magnetic bottle type and is n not made up of solenoids through which an electric current is passed in the same direction as illustrated in FIG. 1, but of permanent magnets 13 magnetised in a direction parallel with the direction in which the product 2 is displaced.

Three permanent magnets 13 are mounted in the direction of displacement 2. The north pole of one of the magnets is disposed facing the south pole of the adjacent magnet. As a result, the magnetic field between two adjacent magnets is aligned in the same direction. It is substantially parallel with the axis of displacement 2 and exhibits a minimum value at the centre of the zone between two successive magnets, as illustrated in FIG. 8. The secondary electrons of the discharge 10 are reflected by the mirrors constituted by the magnetic poles of the magnets, where the magnetic field is at is maximum and equal to $B_{max}$. The discharge is confined between each pair of successive magnets. A magnetron discharge is formed around the substrate in each zone, disposed between two successive magnets. Clearly, the return of the magnetic field forces an reversal of the direction of the induction field in the free passage between the permanent magnets, enabling the product to be passed through. This configuration is particularly practical as a means of treating metal wires.

Another embodiment of the device proposed by the invention, illustrated in FIG. 9, differs from that of FIG. 7 due to the fact that the three permanent magnets 13 are mounted with the north pole of one of the magnets aligned facing the north pole of the adjacent magnet and conversely the south pole facing the south pole of the adjacent magnet. Accordingly, a cusp can be obtained in the component parallel with the induction field in the feed direction 2, as with the device illustrated in FIG. 3. The presence of a point may be seen, at which the sign of the component parallel with the axis 2 of the induction field is reversed between two successive magnets, as illustrated in FIG. 10.

The plasma 10 is confined along the axis 2 between the two mutually facing magnetic surfaces of identical polarity. The plasma 10 is radially confined due to the formation of a magnetic mirror on a surface surrounding the product, closed by the concentration of field lines B moving away from the axis 2 between two successive magnets.

In the embodiment of the device proposed by the invention illustrated in FIG. 11, the discharge is produced between two magnetic mirrors A and C, which enables the electrons to be axially confined. The plasma is confined around the product by means of a series of permanent magnets 14 disposed around the electrostatic enclosure 11. These magnets magnetically push the electrons and hence the plasma from this enclosure 11 back towards the product 1.

In effect, these permanent magnets 14 constitute a series of magnetic mirrors, which force the electrons back in the direction of the substrate 1. It goes without saying that the magnets may be disposed in different layouts, such as those described in the background literature [J. R. Roth, Industrial Plasma Engineering, Vol. 1, IOP Publishing (1995), ISBN 0 7503 0318 2]. This configuration is particularly practical if it is desirable to avoid the presence of any magnetic field in the confinement zone of the plasma 10. As illustrated in FIG. 12, the magnetic field is negligible on a level with the displacement axis 2 between the magnetic mirrors A and C. This configuration also enables plasmas 10 to be produced in zones of a large volume.

The configuration of the device illustrated in FIG. 13 is identical to the one above except for the means used to generate the magnetic field at the surface of the enclosure 11. In this case, the permanent magnets are in fact replaced by a series of solenoids 15 through which currents are successively passed in opposite directions.

As illustrated in FIG. 14, the variation in the magnetic induction field of the device illustrate in FIG. 13 is the same as that shown in FIG. 12.

FIG. 15 illustrates the discharge and the behaviour of the electrons in the treatment zone disposed between two magnetic mirrors, where the magnetic induction field B is equal to $B_{min}$. The magnetic mirrors are disposed in planes perpendicular to the displacement axis 2 of the substrate 1. The latter is negatively polarised with respect to the counter-electrode 9.

The formation of a cathodic sheath 16 may be seen at the surface of the substrate 1. Inside this sheath 16, the electric field E enables the ions to be accelerated towards the substrate surface. On impact of the latter, the secondary electrons which are emitted are accelerated towards the plasma by the same field, as a result of which the perpendicular component $v_{perp}$ of their velocity is on average much higher, by reference to the direction of the field B, than the parallel component $v_{para}$ of this same velocity. The angle of confinement θ is therefore greater than the angle of critical confinement $θ_{cr}$ for as long as a significant part of their energy is not lost in inelastic collisions. As a result, these electrons are reflected along trajectories 17 in the discharge, provided this condition is met. The counter-electrode 9 enables electrons which have lost their kinetic energy and which have therefore been thermalised to be returned towards the generator, not illustrated in the drawing.

The counter-electrode may operate as an anode with continuous current or intermittently as a cathode and as an anode in the case of alternating current. This being the case, several means may be used to prevent the latter from being attacked by ions when negatively polarised with respect to the product.

In a first means, the anodes are positioned only on a level with the magnetic mirrors, i.e. in a zone where the plasma density is normally lower than between two mirrors, because it is here that the electrons are pushed back.

A second approach is to reduce the time during which the counter-electrode is negatively polarised compared with the time during which it is positively polarised. In effect, the time during which the substrate is negatively polarised may be much longer than the time during which it is positively polarised because the electrons are displaced more quickly than the ions due to their much lower mass. Consequently, it is possible to use generators with pulsed currents or alternatively generators with currents that are simply rectified (not smoothed). The advantage of using a discharge with alternating current is the sharp reduction in the likelihood of "unipolar" arcs appearing on the treated surface due to electric neutralisation of charges forming at the surface of dielectric impurities such as grease and oxides still present on the surface of the product to be treated. These charges form naturally during ion bombardment and are neutralised by the flow of electrons when the product is positively polarised with respect to the counter-electrode.

Typically, an alternating current is used, at a frequency of between 10 kHz and 100 kHz.

If using continuous current, the anode may be positioned anywhere, generally speaking. By preference, the substrate is kept at the ground potential of the installation.

FIG. 16 illustrates a section in a transverse direction, perpendicular to the direction of displacement 2. The magnetic field B is therefore perpendicular to the plane of the page. This drawing illustrates how the electrons are displaced around the substrate 1 along a trajectory 17 under the combined influence of the magnetic field and the electrical field of the sheath 16. A magnetron discharge is therefore formed around the substrate, as illustrated in FIG. 16. As a result, the process naturally adapts to any variation in the thickness (th) and width (w) of the substrate 1.

The electrons rotate about the field lines, whilst the ions bombard the substrate 1. The trajectories 17 of the electrons are a result of the fact that the magnetic induction field is disposed in the direction perpendicular to the electric field of the sheath, which is always aligned perpendicular to the substrate surface.

All the magnetic confinement devices may be used either disposed in the interior of (as illustrated in the various drawings) or externally to the tank 3. In the latter case, the tank 3 must be made from a non-ferromagnetic material, such as stainless steel or aluminium, to enable the magnetic induction field to penetrate the interior of the tank 3.

For the same reason, the confinement enclosure 11 must also be made from a non-ferromagnetic material.

Examples of Practical Applications

1. Cleaning Sheets of Hot-Rolled Mild Steel

A device for cleaning sheets of hot-rolled mild steel was set up using the configuration illustrated in FIG. 5.

In this device, the three solenoids A, B and C with rectangular-shaped cross-sections perpendicular to the axis of displacement 2 are of identical dimensions. The length of each solenoid is 400 mm, whilst the mean dimension of the rectangular section is 400 mm by 1000 mm. Each solenoid comprises a winding of copper wire.

The two outer solenoids constituting the magnetic mirrors A and C each consume an electric power of 2.240 kW. The central solenoid is supplied with a continuous current of 0.7 A at 800 V, i.e. an electric power consumption of 560 W. The total electric power consumption needed to generate the induction field B is therefore approximately 5 kW. The three solenoids are disposed in sealed carcasses that are permeable to the magnetic field surrounding the product in the interior of the tank 3.

This configuration enables a maximum field $B_{max}$ of $5.10^{-2}$ T to be obtained and a minimum induction field $B_{min}$ equal to $2.5 \cdot 10^{-2}$ T in the central zone where a magnetron discharge is produced around the substrate in the argon, maintained at a pressure of 0.5 Pa (5 mbar).

Under these conditions, the voltage between anode and cathode is in the order of 500 V for an electric current of 304 A, i.e. an electric power consumption of 152 kW in the discharge.

This results in an average power in the order of 19 W/cm² dissipated at the surface of the substrate, constituting the cathode of the system, due to a bombardment of argon ions, which corresponds to an electronic density of $1.14 \times 10^{12} cm^{-3}$ in the plasma. The critical discharge angle of the electrons $θ_{cr}$ is 45° under these conditions because $\sin θ_{cr} = (250/500)^{1/2}$.

The secondary electrons accelerated in the sheath are therefore largely confined by the magnetic mirrors prior to inelastic collisions, the discharge angle θ immediately after acceleration effectively being 84°, which is higher than 45°. It may also be demonstrated that, under these conditions, 71% of the "thermalised" electrons are confined between the two magnetic mirrors A and C.

The return of current towards the counter-electrodes positioned on a level with the mirrors A and C is therefore due to electrons whose discharge angle is smaller than 45°, which corresponds to 29% of the population of "thermalised" electrons. The gyration radius of the secondary electrons accelerated at 500 V is 3 mm and therefore exceeds the value of the thickness of the cathode sheath, which is in the order of 0.5 mm at the surface of the substrate.

Having been accelerated in the sheath, and without undergoing any collision during this acceleration, the ions bombard the surface of the substrate at a virtually normal incidence.

Four devices of the type described above enabled the sheet to be cleaned sufficiently at a speed of 100 m/min to ensure excellent adhesion by a deposit of zinc of a thickness 7 μm by "ion plating" on the two faces of a sheet one millimeter thick, the temperature of which was not more than a hundred degrees centigrade after treatment.

The sheet was kept grounded whilst the counter-electrodes were supplied with a current pulsed at 40 kHz. The latter served as the anodes of the system during the greater part of the voltage cycle. During this anode phase of the counter-electrodes, the surface of the sheet was bombarded with argon ions, whereas the short cathode phase of the counter-electrodes enabled the positive charges at the surface of the sheet to be neutralised, thereby ensuring a discharge without electric arcing.

The same device enabled sheets of lesser widths and different thicknesses to be treated without having to make any modifications to the device other than adapting the electric power consumption. A series of wires or parallel strips could then be treated without any modification to the cleaning process other than adapting the electrical power to suit the product being treated.

2. Heating a Cold-Rolled Steel Sheet in an Annealing Process Under Vacuum by Cold Plasma.

The same device as that described in point one above, comprising four units of three successive solenoids, each fitted with anodes at the centre of the magnetic mirrors, enabled a sheet 1 m wide and 0.18 mm thick to be heated to a temperature of 600° C. at a rate of 100 m/min, before cooling at low pressure on metal cooling rollers, which were in turn cooled with water. To prevent excessive erosion of the sheet due to ion bombardment, the argon pressure was maintained at 10 Pa. Each of the four heating units consumed a power of 180 kW, which corresponded to a total power of 720 kW. The density of power dissipated in the treatment zone was 22.5 W/cm². The four heating units were distributed over 8 m and the average rate of the rise in temperature was estimated to be 125° C./s. Modifying the number of heating units and the power consumed by the heating units enabled both the temperature to be obtained and the rate of temperature rise to be modified. The same device enabled sheets of smaller widths and different thicknesses to be treated without any modification to the device other than adapting the electrical power consumption.

3. Cleaning a Mild Steel Wire Prior to Coating with Zinc

A mild steel wire was cleaned using a device of the type illustrated in FIG. 7. The wire passed through eleven treatment units, each bounded by a pair of permanent magnets NeFeB. The effective length of each treatment zone was 10 cm, i.e. a 1.1 m effective treatment length in total. A steel wire with a diameter of 5 mm fed at a rate of 300 m/min was effectively cleaned prior to coating with zinc by "ion plating" at an argon pressure of 0.5 Pa consuming electrical power in the order of 15 kW. The mean power density in this case was 90 W/cm² and the rise in temperature of the wire remained below 40 K.

As explained in the description, the present invention in all cases has the major advantage of enabling a magnetically confined discharge to be produced around the external surface of a metal substrate as it is fed along, thereby enabling its entire external surface to be continuously treated, irrespective of the shape of the substrate being treated. No modification is necessary other than adapting the power.

In one particularly practical configuration of the method proposed by the invention, apart from confining the discharge around the product, the presence of an induction field parallel with the product enables a high-density magnetron discharge to be produced around the latter. This being the case, it is clear that the use of magnetic mirrors is an effective but not indispensable means of limiting plasma losses at the inlet and outlet of the treatment zone.

Naturally, the invention is not restricted to the different embodiments of the method and device described above and illustrated in the appended drawings and other variants would also be conceivable, particularly as regards the structure and shape of the tank (3), the position and shape of the solenoids or permanent magnets and the number of magnetic mirrors, without departing from the scope of this invention.

What is claimed is:

1. Treatment method for cleaning and/or heating a metal substrate (1), comprising feeding the substrate (1) along an axis of displacement (2) in a substantially continuous manner through a vacuum chamber (3), having a treatment zone in which an electric discharge (10), comprising a plasma, and a magnetic field are generated in a gas maintained at a pressure below atmospheric pressure, between at least the substrate (1), acting as an electrode, and at least one counter-electrode (9) to enable the substrate (1) to be bombarded by the ions produced in the electric discharge (10), generating a confining magnetic induction field entirely around the substrate (1) in the treatment zone so that the electric discharge (10) is confined to the area all around the substrate (1) in said treatment zone due to a confinement of electrons released in the electric discharge (10), whereby the confining magnetic induction field that is generated comprises a magnetic mirror through which the substrate (1) is fed.

2. Method as claimed in claim 1, characterised in that the magnetic induction field is generated in said treatment zone substantially parallel with the axis of displacement (2) of the substrate (1) through this treatment zone to enable a magnetron discharge to be formed around the substrate (1) by a circulation of electrons from the discharge along trajectories (17) extending around the substrate (1).

3. Method as claimed in claim 1, characterised in that a magnetic induction field is produced, the component of which parallel with the displacement axis (2) is at least equal to $10^{-3}$ T (10 Gauss) in said treatment zone.

4. Method as claimed in claim 1, characterised in that at least one magnetic mirror is produced entirely around the substrate in the treatment zone.

5. Method as claimed in claim 4, characterised in that a magnetic induction field is generated essentially transversely to the axis of displacement (2) of the substrate (1), the intensity of which increases by at least a factor of two from the substrate (1) to the magnetic mirror.

6. Method as claimed in claim 1, characterised in that at least two magnetic mirrors through which the substrate (1) is passed are set up and define the inlet and the outlet of the treatment zone, in order to confine the electric discharge in a direction substantially parallel with the axis along which the substrate (1) is displaced through the treatment zone.

7. Method as claimed in claim 6, characterised in that a magnetic induction field is formed by said magnetic mirrors, which is substantially parallel with the displacement axis of the substrate (1), the intensity of which decreases at an increasing distance from each mirror towards the centre of the treatment zone.

8. Method as claimed claim 6, characterised in that a magnetic induction field is produced at the centre of the magnetic mirrors that has a value higher than any value of the magnetic induction field in a direction substantially parallel with the axis of displacement through the treatment zone and at least equal to twice the value of a minimum magnetic induction field in the vicinity of the substrate (1) inside the treatment zone.

9. Method as claimed in claim 6, characterised in that the maximum induction field produced by a magnetic mirror is at least equal to $5.10^{-3}$ T (50 Gauss).

10. Method as claimed in claim 1, characterised in that a continuous voltage is applied between the substrate (1) acting as an electrode and the counter-electrode (9) so that the substrate (1) is negatively polarised with respect to this counter-electrode (9).

11. Method as claimed in claim 1, characterised in that an alternating voltage is applied between the substrate (1) acting as an electrode and the counter-electrode (9).

12. Method as claimed in claim 11, characterised in that an alternating voltage is applied between the substrate (1) and the counter-electrode (9) at a frequency of between 1 kHz and 1 MHz.

13. Method as claimed in claim 11, characterised in that the counter-electrode (9) is negatively polarised with respect to the substrate (1) for a shorter time than the time during which it is positively polarised.

14. Method as claimed in claim 1, characterised in that in order to heat the substrate (1), an electric discharge is produced in a gas maintained at a pressure higher than or equal to 1 Pa (0.01 mbar).

15. Method as claimed in claim 1, characterised in that in order to clean the substrate (1) by bombarding it with positive ions, an electric discharge is generated in a gas maintained at a pressure below 1 Pa (0.01 mbar) in said treatment zone.

16. Method as claimed in claim 1, characterised in that the electric discharge is produced in a gas comprising one or more of the following elements: argon, helium, hydrogen, nitrogen, oxygen, ad a hydrocarbon compound.

17. Method as claimed in claim 1, characterised in that an electric discharge is produced between the counter-electrode (9) and the substrate (1) whilst maintaining a maximum difference in potential between the counter-electrode (9) and the substrate (1) of less than or equal to 1000 V for mean power densities of between 1 Wcm$^{-2}$ et 200 Wcm$^{-2}$ per unit of surface area of the substrate (1).

18. Device for treating a metal comprising
a vacuum chamber (3) through which a metal substrate (1) is fed in a substantially continuous manner,
a treatment zone in which an electric discharge is generated,
magnetic confining means for confining electrons produced in the electric dischargem, and
at least one counter-electrode (9) disposed facing the substrate (1) acting as an electrode and enabling this electric discharge to be generated,
wherein the magnetic confining means comprise at least one magnetic mirror which is disposed around the treatment zone through which the substrate (1) is fed, so as to reflect and send back to the substrate (1) the electrons moving away from the substrate, thereby confining the electric discharge to the an area around the substrate (1) inside said treatment zone so that the ions produced in the electric discharge are maintained entirely around the substrate (1) and thus bombard the surface of the substrate.

19. Device as claimed in claim 18, characterised in that at least one magnetic mirror is disposed around the treatment zone through which the substrate (1) is fed, so as to reflect and send back to the substrate (1) the electrons moving away from the latter, thereby confining the electric discharge to the area around the substrate (1) inside this zone.

20. Device as claimed in claim 19, characterised in that said magnetic mirror is set up by a juxtaposition of at least two successive solenoids (6) past which the substrate (1) is fed and disposed along the axis of displacement of the substrate (1), through which electric currents are successively passed in opposite directions.

21. Device as claimed in claim 19, characterised in that said magnetic mirror is set up by means of at least two successive magnets magnetised in opposite directions along the direction of displacement of the substrate (1) and having an opening through which the substrate (1) is passed.

22. Device as claimed in claim 19, characterised in that said magnetic mirror is made up of a series of magnets disposed around the treatment zone on either side so as to be able to reflect the electrons towards the substrate, and magnetised in a direction disposed transversely to the direction of displacement of the substrate (1).

23. Device as claimed in claim 21, characterised in that the magnets are made up of an assembly of magnets magnetised in the same direction and disposed in the same direction.

24. Device as claimed in claim 18, characterised in that it has at least one solenoid (6) with an axis substantially parallel with the axis of displacement of the substrate (1) around the treatment zone.

25. Device as claimed in claim 18, characterised in that it has at least two magnetic mirrors bounding the treatment zone in the direction of displacement of the substrate (1).

26. Device as claimed in claim 25, characterised in that it has at least two successive magnets magnetised in the same direction disposed in the direction of displacement of the substrate (1) and having an opening through which this substrate (1) is passed (1).

27. Device as claimed in claim 25, characterised in that it has at least two successive magnets magnetised in opposite directions in the direction of displacement of the substrate (1) and having an opening through which the substrate (1) is passed.

28. Device as claimed in claim 25, characterised in that it has at least two solenoids (6) capable of creating a magnetic induction field in the direction of displacement of the substrate (1) and being disposed about the axis of displacement of this substrate (1) so that the latter can be fed through.

29. Device as claimed in claim 18, characterised in that said counter-electrode (9) is disposed substantially in the vicinity of said at least one magnetic mirror past which the substrate (1) is fed (1).

30. Device as claimed in claim 18, characterised in that the vacuum chamber (3) is a confinement enclosure (11) bounded by walls of a non-ferromagnetic material, which is electrically insulated from the substrate (1) and the counter-electrode (9).

31. Device as claimed in claim 30, characterised in that the magnetic confining means are disposed externally to the confinement enclosure (11) between the external wall of the latter and the internal wall of the vacuum chamber (3).

32. Device as claimed in claim 18, characterised in that the magnetic confining means are disposed externally to the vacuum chamber, in which case the walls thereof are made from non-ferromagnetic materials.

* * * * *